(12) United States Patent
Kwon et al.

(10) Patent No.: US 10,572,341 B2
(45) Date of Patent: Feb. 25, 2020

(54) SEMICONDUCTOR DEVICES

(71) Applicant: SK hynix Inc., Icheon-si, Gyeonggi-do (KR)

(72) Inventors: Kihun Kwon, Yongin-si (KR); Yong Mi Kim, Hwaseong-si (KR); Jaeil Kim, Yongin-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/687,681

(22) Filed: Aug. 28, 2017

(65) Prior Publication Data
US 2018/0267852 A1 Sep. 20, 2018

(30) Foreign Application Priority Data

Mar. 20, 2017 (KR) .................. 10-2017-0034874

(51) Int. Cl.
| | |
|---|---|
| G06F 11/10 | (2006.01) |
| G11C 29/52 | (2006.01) |
| G11C 16/32 | (2006.01) |
| G11C 8/08 | (2006.01) |
| G11C 29/04 | (2006.01) |

(52) U.S. Cl.
CPC ........ *G06F 11/1068* (2013.01); *G06F 11/106* (2013.01); *G11C 8/08* (2013.01); *G11C 16/32* (2013.01); *G11C 29/52* (2013.01); *G11C 2029/0409* (2013.01)

(58) Field of Classification Search
CPC .... G06F 11/1068; G06F 11/106; G11C 29/52; G11C 16/32; G11C 2029/0409; G11C 8/08; G11C 16/345; G11C 16/24; G11C 16/105; G11C 16/08

USPC .......................................... 714/807
See application file for complete search history.

(56) References Cited

U.S. PATENT DOCUMENTS

| | | | | |
|---|---|---|---|---|
| 7,350,134 B2* | 3/2008 | Goel | ................... | G06F 11/1008 714/764 |
| 7,877,668 B2* | 1/2011 | Sugahara | ............ | G06F 11/1068 365/148 |
| 8,032,816 B2* | 10/2011 | Spanel | ................ | G06F 11/1012 714/765 |
| 8,281,220 B2* | 10/2012 | Kitahara | ............... | G06F 11/073 365/185.09 |

(Continued)

FOREIGN PATENT DOCUMENTS

KR 1020140067875 A 6/2014

*Primary Examiner* — James C Kerveros
(74) *Attorney, Agent, or Firm* — William Park & Associates Ltd.

(57) ABSTRACT

A semiconductor device includes an error count signal generation circuit and a row error control circuit. The error count signal generation circuit generates an error count signal which is enabled if the number of erroneous data of cells selected to perform an error scrub operation is equal to a predetermined number. The row error control circuit stores information concerning the number of the erroneous data in response to the error count signal if the number of the erroneous data is greater than or equal to the predetermined number or stores information concerning the number of row paths exhibiting the erroneous data in response to the error count signal after more erroneous data than the predetermined number is detected.

18 Claims, 14 Drawing Sheets

(56) References Cited

U.S. PATENT DOCUMENTS

| | | | | |
|---|---|---|---|---|
| 8,443,262 B2* | 5/2013 | Foley | G11C 29/028 | 714/718 |
| 8,522,114 B2* | 8/2013 | Chang | G06F 11/1048 | 714/773 |
| 8,640,006 B2* | 1/2014 | Carman | G06F 11/106 | 714/710 |
| 8,689,081 B2* | 4/2014 | Yu | G06F 11/1048 | 714/764 |
| 9,026,892 B2* | 5/2015 | Inada | G06F 11/1068 | 714/773 |
| 9,037,946 B2* | 5/2015 | Jeon | G11C 16/3404 | 714/721 |
| 2010/0332949 A1 | 12/2010 | d'Abreu et al. | | |

* cited by examiner

SEMICONDUCTOR DEVICES

CROSS-REFERENCE TO RELATED APPLICATIONS

The present application claims priority under 35 U.S.C 119(a) to Korean Application No. 10-2017-0034874, filed on Mar. 20, 2017, which is incorporated herein by reference in its entirety.

BACKGROUND

1. Technical Field

Embodiments of the present disclosure relate to semiconductor devices having an error detection function.

2. Related Art

Recently, a DDR2 scheme or a DDR3 scheme receiving and outputting four bit data or eight bit data during each clock cycle time has been used to improve operation speed of semiconductor devices. If data transmission speed of the semiconductor devices becomes faster, the probability of errors occurring may increase while the data is transmitted in the semiconductor devices. Accordingly, novel design schemes have been proposed to improve the reliability of data transmission.

Whenever data is transmitted in semiconductor devices, error codes which are capable of detecting the occurrence of errors may be generated and transmitted with the data to improve the reliability of data transmission. The error codes may include an error detection code (EDC) which is capable of detecting errors and an error correction code (ECC) which is capable of correcting the errors by itself.

SUMMARY

According to an embodiment, a semiconductor device includes an error count signal generation circuit and a row error control circuit. The error count signal generation circuit generates an error count signal which is enabled if the number of erroneous data of cells selected to perform an error scrub operation is equal to a predetermined number. The row error control circuit stores information concerning the number of the erroneous data in response to the error count signal if the number of the erroneous data is greater than or equal to the predetermined number or stores information concerning the number of row paths exhibiting the erroneous data in response to the error count signal after more erroneous data than the predetermined number is detected.

According to another embodiment, a semiconductor device includes a pulse selection circuit configured to output a critical error pulse or a row critical error pulse as a selected error pulse in response to a pulse selection signal, a latch information generation circuit configured to output a latch information signal that is counted in synchronization with the selected error pulse, and an information storage circuit configured to store the latch information signal in synchronization with a storage control pulse. The critical error pulse is generated whenever an additional erroneous datum is detected from a point of time that the number of the erroneous data of cells selected during an error scrub operation is equal to a predetermined number. The row critical error pulse is generated whenever an additional erroneous datum is detected for each of row path from a point of time that the number of the erroneous data of the cells selected during the error scrub operation is equal to the predetermined number.

According to yet another embodiment, a semiconductor device includes a row counter configured to generate a row code that includes a count of the number of the erroneous data included in the cells which are selected by the error scrub operation for each of row paths, a row latch circuit configured to latch the row code to output the latched row code as a latch code if the row code is set to be greater than the latch code, and an address latch circuit configured to latch information concerning the row paths if the row code is set to be greater than the latch code.

BRIEF DESCRIPTION OF THE DRAWINGS

Various embodiments of the present disclosure will become more apparent in view of the attached drawings and accompanying detailed description, in which.

DETAILED DESCRIPTION OF THE EMBODIMENTS

Various embodiments of the present disclosure will be described hereinafter with reference to the accompanying drawings. However, the embodiments described herein are for illustrative purposes only and are not intended to limit the scope of the present disclosure.

Figure 1:
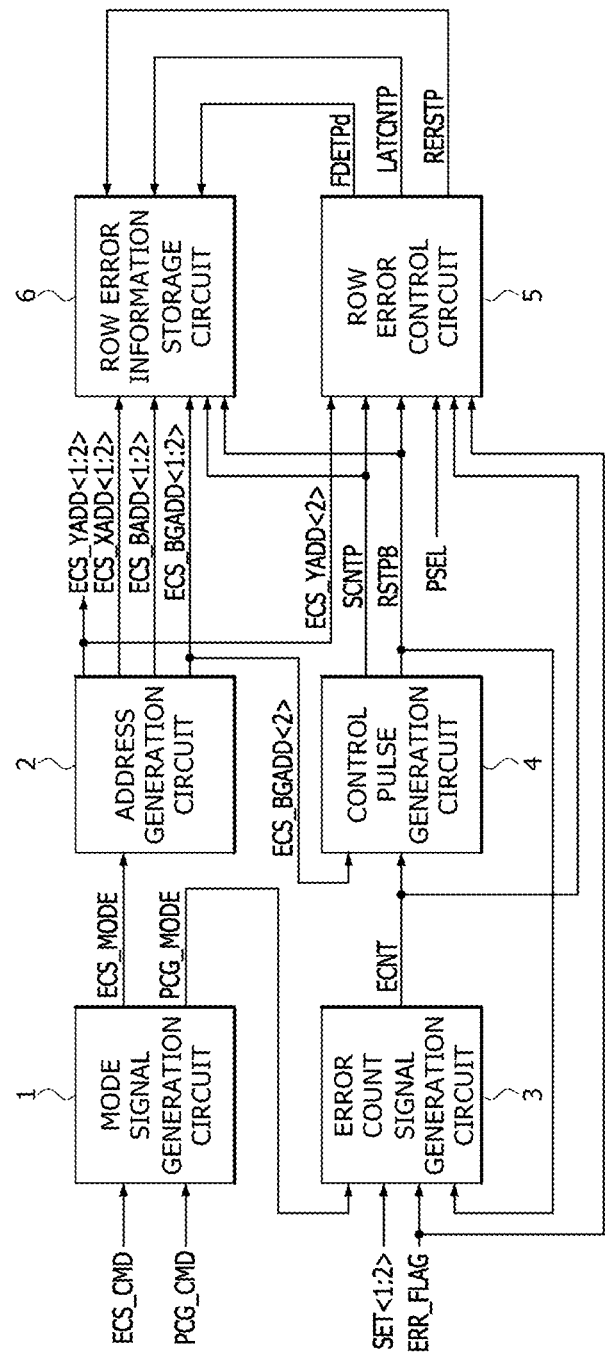
FIG. 1 is a block diagram illustrating a configuration of a semiconductor device according to an embodiment of the present disclosure.

As illustrated in FIG. 1, a semiconductor device according to an embodiment may include a mode signal generation circuit 1, an address generation circuit 2, an error count signal generation circuit 3, a control pulse generation circuit 4, a row error control circuit 5, and a row error information storage circuit 6.

The mode signal generation circuit 1 may generate an error scrub mode signal ECS_MODE and a pre-charge mode signal PCG_MODE in response to an error scrub command ECS_CMD and a pre-charge command PCG_CMD. The mode signal generation circuit 1 may generate the error scrub mode signal ECS_MODE which is enabled in synchronization with a point of time that the error scrub command ECS_CMD is received. The mode signal generation circuit may generate the pre-charge mode signal PCG_MODE in synchronization with receiving the pre-charge command PCG_CMD. The pre-charge mode signal PCG_MODE may be enabled in synchronization with a point of time that the pre-charge command PCG_CMD is enabled, and the pre-charge mode signal PCG_MODE may be disabled in synchronization with a point of time that the pre-charge command PCG_CMD is disabled. The mode signal generation circuit 1 may generate the error scrub mode signal ECS_MODE which is disabled in synchronization with a point of time that the pre-charge command PCG_CMD is disabled. The error scrub mode signal ECS_MODE may be enabled during a period that an error scrub operation is performed. The error scrub operation may be performed by determining whether erroneous data are stored in memory cells of the semiconductor device, by correcting the erroneous data if the erroneous data are stored in the memory cells, and by storing the corrected data into corresponding memory cells. The pre-charge mode signal PCG_MODE may be enabled in synchronization with a time that the error scrub operation terminates to perform a pre-charge operation. The pre-charge operation may be performed to terminate the error scrub operation. In some embodiments, a portion of a period that the error scrub operation is performed may overlap with a portion of a period that the pre-charge operation is performed. Alternatively, the error scrub operation may be performed separately from the pre-charge operation. That is, the period that the error scrub operation is performed may not overlap with the period that the pre-charge operation is performed. A configuration and an operation of the mode signal generation circuit 1 will be described more fully with reference to FIGS. 2 and 3 later.

The address generation circuit 2 may generate an error scrub column address ECS_YADD<1:2>, an error scrub row address ECS_XADD<1:2>, an error scrub bank address ECS_BADD<1:2>, and an error scrub bank group address ECS_BGADD<1:2> in response to the error scrub mode signal ECS_MODE.

The address generation circuit 2 may generate the error scrub column address ECS_YADD<1:2> that is counted in synchronization with a predetermined edge of the error scrub mode signal ECS_MODE where a level of the error scrub mode signal ECS_MODE changes from a first logic level into a second logic level. The predetermined edge of the error scrub mode signal ECS_MODE may be created in synchronization with a point of time that the error scrub operation of selected memory cells (not shown) terminates. The first and second logic levels may be set to be different according to the embodiments. That the error scrub column address ECS_YADD<1:2> is counted means that the error scrub column address ECS_YADD<1:2> is counted up or down bit by bit. For example, the error scrub column address ECS_YADD<1:2> may be counted up bit by bit to have logic level combinations of '00', '01', '10' and '11' in sequence. In the error scrub column address ECS_YADD<1:2>, the logic level combination of '01' means that a first bit (i.e., a first error scrub column address ECS_YADD<1>) of the error scrub column address ECS_YADD<1:2> has a logic "high" level and a second bit (i.e., a second error scrub column address ECS_YADD<2>) of the error scrub column address ECS_YADD<1:2> has a logic "low" level.

The address generation circuit 2 may generate the error scrub row address ECS_XADD<1:2> that is counted in synchronization with a predetermined edge of the second error scrub column address ECS_YADD<2>. The predetermined edge of the second error scrub column address ECS_YADD<2> may be created after all column paths (not shown) included in the semiconductor device are selected. In an embodiment, the column paths may include bit lines. Although the present embodiment describes an example in which four column paths (not shown) are sequentially selected by the error scrub column address ECS_YADD<1:2> having two bits for the purpose of ease and convenience in explanation, the number of bits included in the error scrub column address may be set to be different according to the embodiments.

The address generation circuit 2 may generate the error scrub bank address ECS_BADD<1:2> that is counted in synchronization with a predetermined edge of a second bit (i.e., a second error scrub row address ECS_XADD<2>) of the error scrub row address ECS_XADD<1:2>. The predetermined edge of the second error scrub row address ECS_XADD<2> may be created after all row paths (not shown) included in the semiconductor device are selected. In an embodiment, the row paths may include word lines. Although the present embodiment describes an example in which four row paths (not shown) are sequentially selected by the error scrub row address ECS_XADD<1:2> having two bits for the purpose of ease and convenience in explanation, the number of bits included in the error scrub row address may be set to be different according to the embodiments.

The address generation circuit 2 may generate the error scrub bank group address ECS_BGADD<1:2> that is counted in synchronization with a predetermined edge of a second bit (i.e., a second error scrub bank address ECS_BADD<2>) of the error scrub bank address ECS_BADD<1:2>. The predetermined edge of the second error scrub bank address ECS_BADD<2> may be created after all banks (not shown) included in the semiconductor device are selected. Although the present embodiment describes an example in which four banks (not shown) are sequentially selected by the error scrub bank address ECS_BADD<1:2> having two bits for the purpose of ease and convenience in explanation, the number of the bits included in the error scrub bank address may be set to be different according to the embodiments. Although the present embodiment describes an example in which four bank groups (not shown) are sequentially selected by the error scrub bank group address ECS_BGADD<1:2> having two bits for the purpose of ease and convenience in explanation, the number of bits included in the error scrub bank group address may be set to be different according to the embodiments. A configuration and an operation of the address generation circuit 2 will be described more fully with reference to FIGS. 4 and 5 later.

The error count signal generation circuit 3 may generate an error count signal ECNT in response to one or more of the pre-charge mode signal PCG_MODE, a set code SET<1:2>, an error flag ERR_FLAG, and a reset pulse RSTPB. The error count signal generation circuit 3 may determine whether erroneous data are stored in memory cells (not shown) of the semiconductor device and may generate the error count signal ECNT which is enabled if the number of the erroneous data is equal to a value which is set by the set code SET<1:2>. The error count signal generation circuit 3 may disable the error count signal ECNT if the reset pulse RSTPB is created. The error flag ERR_FLAG may be enabled if erroneous data are stored in memory cells which are selected for the error scrub operation. A configuration and an operation of the error count signal generation circuit 3 will be described more fully with reference to FIGS. 6 to 9 later.

The control pulse generation circuit 4 may generate a storage control pulse SCNTP and the reset pulse RSTPB in response to the error count signal ECNT and a second bit (i.e., a second error scrub bank group address ECS_B-GADD<2>) of the error scrub bank group address ECS_B-GADD<1:2>. The control pulse generation circuit 4 may generate the storage control pulse SCNTP in synchronization with a predetermined edge of the second error scrub bank group address ECS_BGADD<2> while the error count signal ECNT is enabled. The control pulse generation circuit 4 may generate the storage control pulse SCNTP after all of the memory cells included in the semiconductor device are selected for the error scrub operation, if the number of erroneous data in the selected memory cells is greater than or equal to a predetermined number. The control pulse generation circuit 4 may generate the reset pulse RSTPB in synchronization with the predetermined edge of the second error scrub bank group address ECS_BGADD<2>. The control pulse generation circuit 4 may generate the reset pulse RSTPB after the error scrub operation is performed on all of the memory cells included in the semiconductor device. The control pulse generation circuit 4 may generate a reset pulse RSTPB for each of the row paths and may generate a storage control pulse SCNTP for each of the row paths while the error count signal ECNT is enabled. A configuration and an operation of the control pulse generation circuit 4 will be described more fully with reference to FIGS. 10 and 11 later.

The row error control circuit 5 may generate a delayed flag detection pulse FDETPd, a latch control pulse LATCNTP, and a row error reset pulse RERSTP in response to the second error scrub column address ECS_YADD<2>, the storage control pulse SCNTP, the reset pulse RSTPB, a pulse selection signal PSEL, the error count signal ECNT, and the error flag ERR_FLAG. The row error control circuit 5 may store information on the number of erroneous data in response to at least one of the error count signal ECNT and the error flag ERR_FLAG, if the pulse selection signal PSEL has a first logic level and the number of the erroneous data is greater than or equal to a predetermined number. The row error control circuit 5 may store information on the number of row paths (not shown) exhibiting the erroneous data after more erroneous data than the predetermined number is detected, in response to the second error scrub column address ECS_YADD<2>, the error count signal ECNT and the error flag ERR_FLAG, if the pulse selection signal PSEL has a second logic level. The row error control circuit 5 may generate the delayed flag detection pulse FDETPd after a predetermined delay time elapses from a point of time that the error flag ERR_FLAG is enabled. The row error control circuit 5 may be synchronized with a predetermined edge of the second error scrub column address ECS_YADD<2> to sequentially generate the latch control pulse LATCNTP and the row error reset pulse RERSTP for each of the row paths (not shown). A configuration and an operation of the row error control circuit 5 will be described more fully with reference to FIG. 12 later.

The row error information storage circuit 6 may receive and store the error scrub row address ECS_XADD<1:2>, the error scrub bank address ECS_BADD<1:2> and the error scrub bank group address ECS_BGADD<1:2> in response to the storage control pulse SCNTP, the reset pulse RSTPB, the delayed flag detection pulse FDETPd, the latch control pulse LATCNTP and the row error reset pulse RERSTP. The row error information storage circuit 6 may store the number of erroneous data of the memory cells selected during the error scrub operation for each of the row paths (not shown) and may detect one row path exhibiting the most erroneous data among the row paths using the error scrub operation to store information on the detected row path and information on the number of erroneous data of the memory cells connected to the detected row path. A configuration and an operation of the row error information storage circuit 6 will be described more fully with reference to FIG. 13 later.

Figure 2:
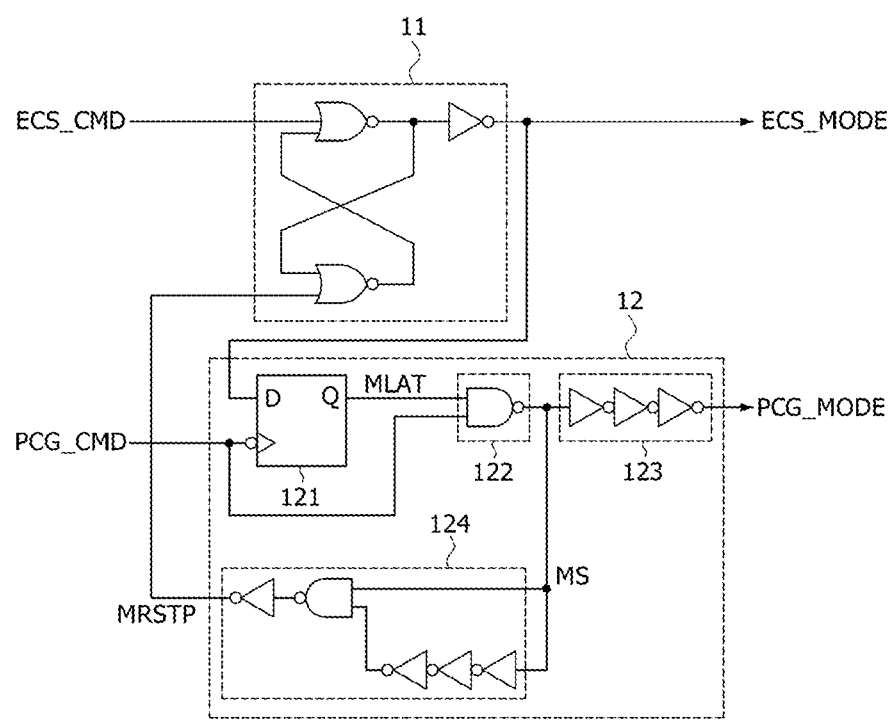
FIG. 2 is a circuit diagram illustrating an example of a mode signal generation circuit included in the semiconductor device of FIG. 1.

Referring to FIG. 2, the mode signal generation circuit 1 may include an error scrub mode signal generation circuit 11 and a pre-charge mode signal generation circuit 12.

The error scrub mode signal generation circuit 11 may generate the error scrub mode signal ECS_MODE in response to the error scrub command ECS_CMD and a mode reset pulse MRSTP. The error scrub mode signal generation circuit 11 may generate the error scrub mode signal ECS_MODE which is enabled to have a logic "high" level if the error scrub command ECS_CMD has a logic "high" level. The error scrub mode signal generation circuit 11 may generate the error scrub mode signal ECS_MODE which is disabled to have a logic "low" level if the mode reset pulse MRSTP has a logic "high" level while the error scrub command ECS_CMD has a logic "low" level. The error scrub mode signal generation circuit 11 may generate the error scrub mode signal ECS_MODE which is enabled during a period that the error scrub operation is performed.

The pre-charge mode signal generation circuit 12 may include a mode latch signal generation circuit 121, a signal synthesis circuit 122, a mode signal output circuit 123, and a reset signal generation circuit 124. The mode latch signal generation circuit 121 may latch and output the error scrub mode signal ECS_MODE as a mode latch signal MLAT in response to the pre-charge command PCG_CMD. The mode latch signal generation circuit 121 may latch and output the error scrub mode signal ECS_MODE as the mode latch signal MLAT while the pre-charge command PCG_CMD has a logic "low" level. The mode latch signal generation circuit 121 may terminate an operation for latching the error scrub mode signal ECS_MODE if the pre-charge command PCG_CMD has a logic "high" level. The signal synthesis circuit 122 may generate a mode signal MS in response to the mode latch signal MLAT and the pre-charge command PCG_CMD. The signal synthesis circuit 122 may generate the mode signal MS having a logic "low" level if both the mode latch signal MLAT and the pre-charge command PCG_CMD have a logic "high" level. The signal synthesis circuit 122 may generate the mode signal MS having a logic "high" level if the pre-charge command PCG_CMD has a logic "low" level. The mode signal output circuit 123 may inversely buffer the mode signal MS to generate the pre-charge mode signal PCG_MODE. The reset signal generation circuit 124 may generate the mode reset pulse MRSTP in response to the mode signal MS. The reset signal generation circuit 124 may generate the mode reset pulse MRSTP if a level of the mode signal MS changes from a logic "low" level into a logic "high" level.

The pre-charge mode signal generation circuit 12 may generate the pre-charge mode signal PCG_MODE and the mode reset pulse MRSTP in response to the error scrub mode signal ECS_MODE and the pre-charge command PCG_CMD. The pre-charge mode signal generation circuit 12 may generate the pre-charge mode signal PCG_MODE which is enabled to have a logic "high" level if the pre-charge command PCG_CMD has a logic "high" level. The pre-charge mode signal generation circuit 12 may generate the pre-charge mode signal PCG_MODE which is enabled during the pre-charge operation. The pre-charge mode signal generation circuit 12 may generate the mode reset pulse MRSTP in synchronization with a point of time that a level of the pre-charge command PCG_CMD changes from a logic "high" level into a logic "low" level. The pre-charge mode signal generation circuit 12 may generate the mode reset pulse MRSTP in synchronization with a point of time that the pre-charge operation terminates.

Figure 3:
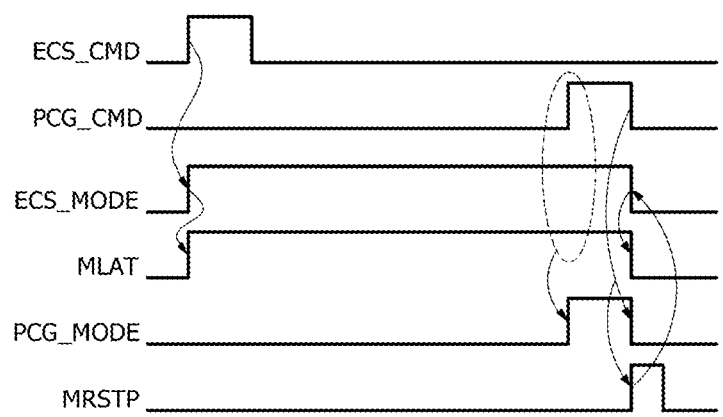
FIG. 3 is a timing diagram illustrating operation of the mode signal generation circuit shown in FIG. 2.

An operation of the mode signal generation circuit 1 will be described hereinafter with reference to FIG. 3.

The error scrub mode signal ECS_MODE and the mode latch signal MLAT may be enabled to have a logic "high" level in synchronization with a point of time that the error scrub command ECS_CMD is created. The pre-charge mode signal PCG_MODE may be enabled to have a logic "high" level if the pre-charge command PCG_CMD is created while the mode latch signal MLAT has a logic "high" level (see a portion indicated by a dotted line). The pre-charge mode signal PCG_MODE may be disabled to have a logic "low" level and the mode reset pulse MRSTP may be generated in synchronization with a point of time that a level of the pre-charge command PCG_CMD changes from a logic "high" level into a logic "low" level. The error scrub mode signal ECS_MODE may be disabled to have a logic "low" level by the mode reset pulse MRSTP.

Figure 4:
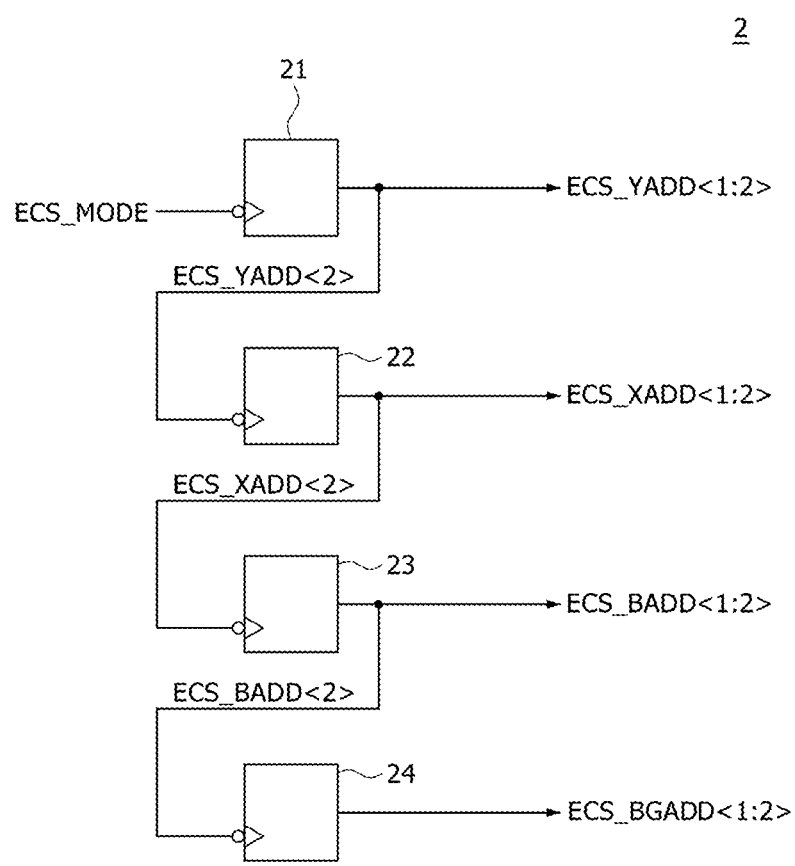
FIG. 4 is a circuit diagram illustrating an example of an address generation circuit included in the semiconductor device of FIG. 1.

Referring to FIG. 4, the address generation circuit 2 may include a first address counter 21, a second address counter 22, a third address counter 23, and a fourth address counter 24.

The first address counter 21 may output the error scrub column address ECS_YADD<1:2> that is counted in response to the error scrub mode signal ECS_MODE. The first address counter 21 may count the error scrub column address ECS_YADD<1:2> in synchronization with a point of time (defined as a falling edge) that a level of the error scrub mode signal ECS_MODE changes from a logic "high" level into a logic "low" level. A logic level combination of the error scrub column address ECS_YADD<1:2> may increase by one bit whenever the error scrub column address ECS_YADD<1:2> is counted. For example, if the error scrub column address ECS_YADD<1:2> having a logic level combination of '01' is counted once, the error scrub column address ECS_YADD<1:2> may be set to have a logic level combination of '10'. In the error scrub column address ECS_YADD<1:2>, the logic level combination of '01' means that the first error scrub column address ECS_YADD<1> has a logic "high" level and the second error scrub column address ECS_YADD<2> has a logic "low" level. The first address counter 21 may be realized using a flip-flop.

The second address counter 22 may output the error scrub row address ECS_XADD<1:2> that is counted in response to the second error scrub column address ECS_YADD<2>. The second address counter 22 may count the error scrub row address ECS_XADD<1:2> in synchronization with a falling edge of the second error scrub column address ECS_YADD<2>. A logic level combination of the error scrub row address ECS_XADD<1:2> may increase by one bit whenever the error scrub row address ECS_XADD<1:2> is counted. The second address counter 22 may be realized using a flip-flop.

The third address counter 23 may output the error scrub bank address ECS_BADD<1:2> that is counted in response to the second error scrub row address ECS_XADD<2>. The third address counter 23 may count the error scrub bank address ECS_BADD<1:2> in synchronization with a falling edge of the second error scrub row address ECS_XADD<2>. A logic level combination of the error scrub bank address ECS_BADD<1:2> may increase by one bit whenever the error scrub bank address ECS_BADD<1:2> is counted. The third address counter 23 may be realized using a flip-flop.

The fourth address counter 24 may output the error scrub bank group address ECS_BGADD<1:2> that is counted in response to the second error scrub bank address ECS_BADD<2>. The fourth address counter 24 may count the error scrub bank group address ECS_BGADD<1:2> in synchronization with a falling edge of the second error scrub bank address ECS_BADD<2>. A logic level combination of the error scrub bank group address ECS_BGADD<1:2> may increase by one bit whenever the error scrub bank group address ECS_BGADD<1:2> is counted. The fourth address counter 24 may be realized using a flip-flop.

Figure 5:
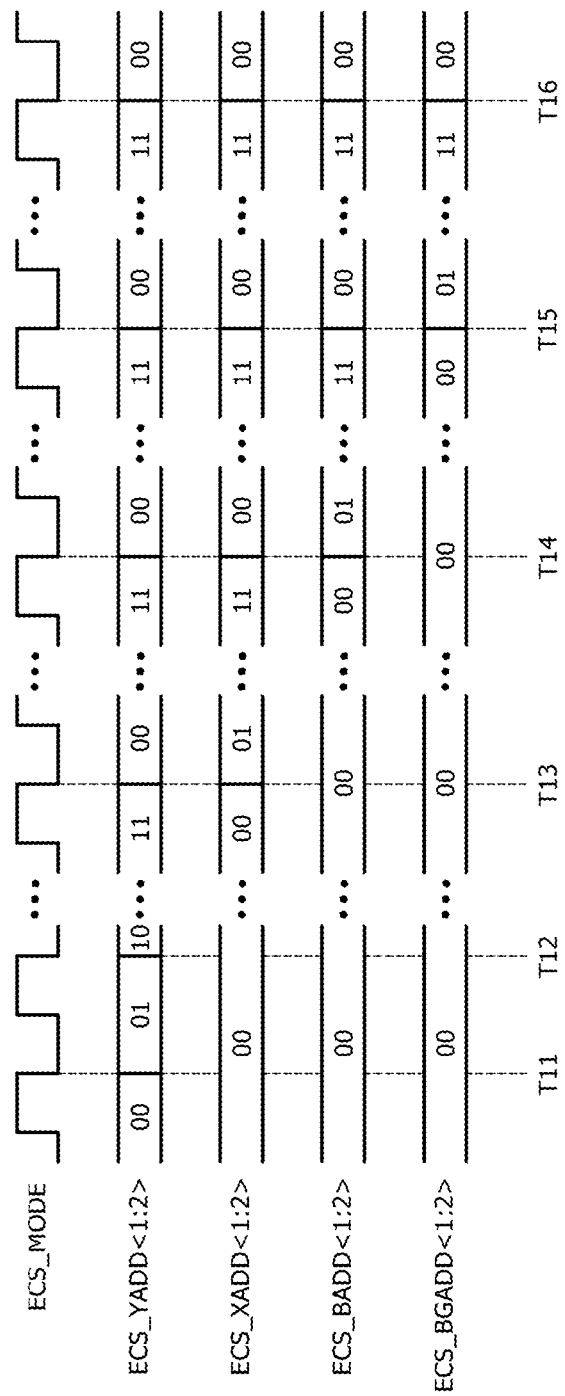
FIG. 5 is a timing diagram illustrating operation of the address generation circuit shown in FIG. 4.

An operation of the address generation circuit 2 will be described hereinafter with reference to FIG. 5 under the assumption that the semiconductor includes four bank groups (i.e., first to fourth bank groups), each of the bank groups includes four banks (i.e., first to fourth banks), and each of the banks includes four row paths (i.e., first to fourth row paths) and four column paths (i.e., first to fourth column paths).

An error scrub operation of a memory cell connected to the first row path and the first column path of the first bank included in the first bank group may be performed by the error scrub mode signal ECS_MODE which is enabled until a point of time "T11". The first bank group may be selected by the error scrub bank group address ECS_BGADD<1:2> having a logic level combination of '00', and the first bank may be selected by the error scrub bank address ECS_BADD<1:2> having a logic level combination of '00'. In addition, the first row path may be selected by the error scrub row address ECS_XADD<1:2> having a logic level combination of '00', and the first column path may be selected by the error scrub column address ECS_YADD<1:2> having a logic level combination of '00'.

At the point of time "T11", the error scrub column address ECS_YADD<1:2> having a logic level combination of '00' may be counted to have a logic level combination of '01'. In a period from the point of time "T11" until a point of time "T12", an error scrub operation of a memory cell connected to the first row path and the second column path of the first bank included in the first bank group may be performed while the error scrub mode signal ECS_MODE is enabled. The second column path may be selected by the error scrub column address ECS_YADD<1:2> which is set to have a logic level combination of '01'.

At the point of time "T12", the error scrub column address ECS_YADD<1:2> having a logic level combination of '01' may be counted to have a logic level combination of '10'. While the error scrub mode signal ECS_MODE is enabled after the point of time "T12", an operation of a memory cell connected to the first row path and the third column path of the first bank included in the first bank group may be performed. The third column path may be selected by the error scrub column address ECS_YADD<1:2> which is set to have a logic level combination of '10'.

An error scrub operation of a memory cell connected to the first row path and the fourth column path of the first bank included in the first bank group may be performed by the error scrub mode signal ECS_MODE which is enabled until a point of time "T13". At the point of time "T13", the error scrub row address ECS_XADD<1:2> having a logic level combination of '00' may be counted to have a logic level combination of '01', and the error scrub column address ECS_YADD<1:2> having a logic level combination of '11' may be counted to have a logic level combination of '00'. After the first to fourth column paths are sequentially selected while the first row path of the first bank included in the first bank group is selected, the second row path of the first bank included in the first bank group may be selected. While the error scrub mode signal ECS_MODE is enabled after the point of time "T13", an error scrub operation of a memory cell connected to the second row path and the first column path of the first bank included in the first bank group may be performed.

An error scrub operation of a memory cell connected to the fourth row path and the fourth column path of the first bank included in the first bank group may be performed by the error scrub mode signal ECS_MODE which is enabled until a point of time "T14". At the point of time "T14", the error scrub bank address ECS_BADD<1:2> having a logic level combination of '00' may be counted to have a logic level combination of '01', the error scrub row address ECS_XADD<1:2> having a logic level combination of '11' may be counted to have a logic level combination of '00', and the error scrub column address ECS_YADD<1:2> having a logic level combination of '11' may be counted to have a logic level combination of '00'. After the first to fourth row paths and the first to fourth column paths of the first bank included in the first bank group are sequentially selected, the second bank included in the first bank group may be selected. While the error scrub mode signal ECS_MODE is enabled after the point of time "T14", an error scrub operation of a memory cell connected to the first row path and the first column path of the second bank included in the first bank group may be performed.

An error scrub operation of a memory cell connected to the fourth row path and the fourth column path of the fourth bank included in the first bank group may be performed by the error scrub mode signal ECS_MODE which is enabled until a point of time "T15". At the point of time "T15", the error scrub bank group address ECS_BGADD<1:2> having a logic level combination of '00' may be counted to have a logic level combination of '01', the error scrub bank address ECS_BADD<1:2> having a logic level combination of '11' may be counted to have a logic level combination of '00', the error scrub row address ECS_XADD<1:2> having a logic level combination of '11' may be counted to have a logic level combination of '00', and the error scrub column address ECS_YADD<1:2> having a logic level combination of '11' may be counted to have a logic level combination of '00'. After the first to fourth row paths and the first to fourth column paths of the first to fourth banks included in the first bank group are sequentially selected, the second bank group may be selected. While the error scrub mode signal ECS_MODE is enabled after the point of time "T15", an error scrub operation of a memory cell connected to the first row path and the first column path of the first bank included in the second bank group may be performed.

An error scrub operation of a memory cell connected to the fourth row path and the fourth column path of the fourth bank included in the fourth bank group may be performed by the error scrub mode signal ECS_MODE which is enabled until a point of time "T16". At the point of time "T16", the error scrub bank group address ECS_BGADD<1:2> having a logic level combination of '11' may be counted to have a logic level combination of '00', the error scrub bank address ECS_BADD<1:2> having a logic level combination of '11' may be counted to have a logic level combination of '00', the error scrub row address ECS_XADD<1:2> having a logic level combination of '11' may be counted to have a logic level combination of '00', and the error scrub column address ECS_YADD<1:2> having a logic level combination of '11' may be counted to have a logic level combination of '00'. After the error scrub operations of all of the memory cells included in the semiconductor device are performed, the error scrub operations may be performed again from the memory cell connected to the first row path and the first column path of the first bank included in the first bank group to the memory cell connected to the fourth row path and the fourth column path of the fourth bank included in the fourth bank group.

Figure 6:
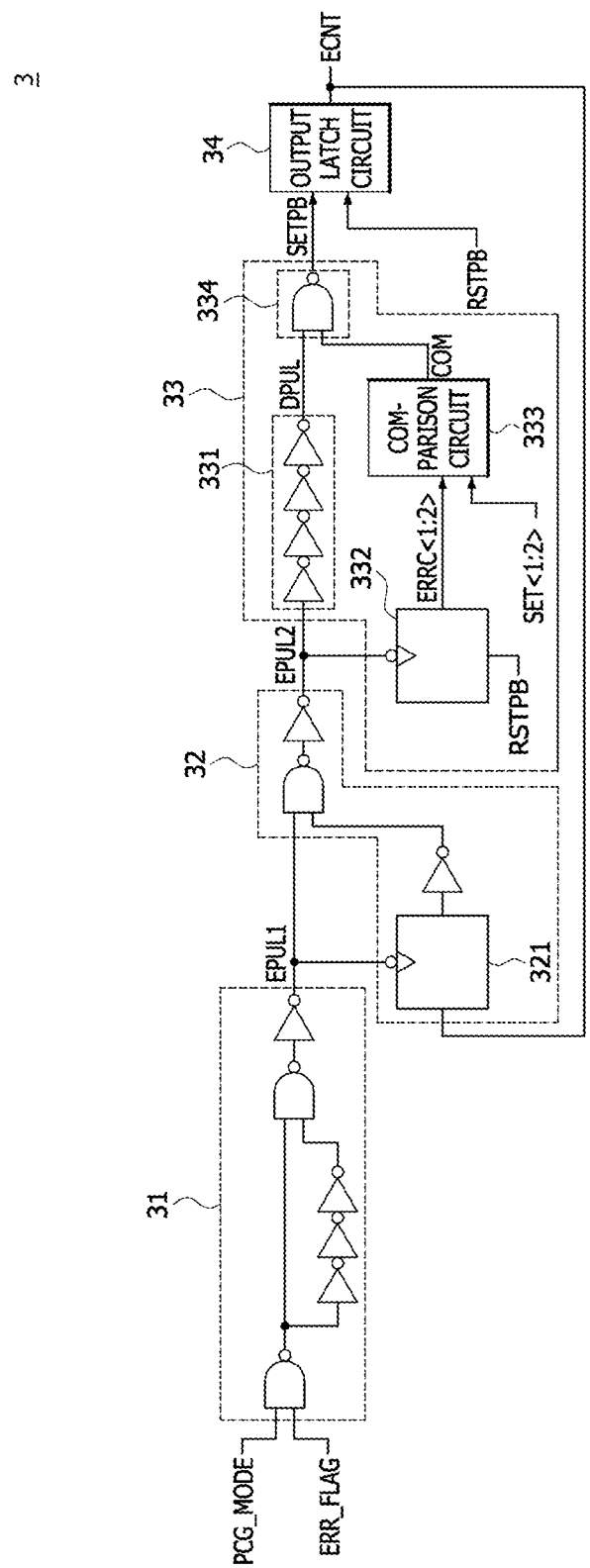
FIG. 6 is a circuit diagram illustrating an example of an error count signal generation circuit included in the semiconductor device of FIG. 1.

Referring to FIG. 6, the error count signal generation circuit 3 may include a first error pulse generation circuit 31, a second error pulse generation circuit 32, a set pulse generation circuit 33, and an error output latch circuit 34.

The first error pulse generation circuit 31 may generate a first error pulse EPUL1 in response to the pre-charge mode signal PCG_MODE and the error flag ERR_FLAG. The first error pulse generation circuit 31 may generate the first error pulse EPUL1 if a level of one of the pre-charge mode signal PCG_MODE and the error flag ERR_FLAG changes from a logic "high" level into a logic "low" level after both the pre-charge mode signal PCG_MODE and the error flag ERR_FLAG are set to have a logic "high" level. The pre-charge mode signal PCG_MODE may be enabled to have a logic "high" level while the pre-charge operation is performed. The error flag ERR_FLAG may be enabled to have a logic "high" level if the error scrub operation of a selected memory cell is performed and the selected memory cell has erroneous datum. The first error pulse generation circuit 31 may generate the first error pulse EPUL1 in response to the pre-charge mode signal PCG_MODE which is enabled in synchronization with a point of time that the error scrub operation of each of the selected memory cells terminates.

The second error pulse generation circuit 32 may generate a second error pulse EPUL2 in response to the error count signal ECNT and the first error pulse EPUL1. The second error pulse generation circuit 32 may include a count signal latch circuit 321. The count signal latch circuit 321 may latch and output the error count signal ECNT while the first error pulse EPUL1 is not created. The second error pulse generation circuit 32 may generate the second error pulse EPUL2 if the first error pulse EPUL1 is created.

The set pulse generation circuit 33 may generate a set pulse SETPB in response to the second error pulse EPUL2. In one example, the set pulse generation circuit 33 may generate the set pulse SETPB if the number of erroneous data corresponding to an error code counted when the selected cell includes an erroneous datum is equal to a predetermined number. The set pulse generation circuit 33 may include a pulse delay circuit 331, an error code generation circuit 332, a comparison circuit 333, and a set pulse output circuit 334. The pulse delay circuit 331 may delay the second error pulse EPUL2 a predetermined delay time to generate a delayed pulse DPUL. The pulse delay circuit 331 may be realized using an inverter chain circuit. The error code generation circuit 332 may be synchronized with the second error pulse EPUL2 to generate an error code ERRC<1:2>. The error code generation circuit 332 may output the error code ERRC<1:2> that is counted if the second error pulse EPUL2 is created. The error code ERRC<1:2> may be counted bit by bit to have logic level combinations of '00', '01', '10', and '11' in sequence. The error code generation circuit 332 may initialize the error code ERRC<1:2> if the reset pulse RSTPB is created. The comparison circuit 333 may compare the error code ERRC<1:2> with the set code SET<1:2> to generate a comparison signal COM. The comparison circuit 333 may generate the comparison signal COM which is enabled to have a logic "high" level if the error code ERRC<1:2> is identical to the set code SET<1:2>. A configuration and an operation of the comparison circuit 333 will be described more fully with reference to FIG. 7 later. The set pulse output circuit 334 may generate the set pulse SETPB in response to the delayed pulse DPUL and the comparison signal COM. The set pulse output circuit 334 may execute a NAND operation of the delayed pulse DPUL and the comparison signal COM to generate the set pulse SETPB. The set pulse output circuit 334 may generate the set pulse SETPB which is enabled to have a logic "low" level if both the delayed pulse DPUL and the comparison signal COM have a logic "high" level.

The error output latch circuit 34 may generate the error count signal ECNT in response to the set pulse SETPB and the reset pulse RSTPB. The error output latch circuit 34 may generate the error count signal ECNT which is enabled to have a logic "high" level if the set pulse SETPB is created. The error output latch circuit 34 may generate the error count signal ECNT which is disabled to have a logic "low" level if the reset pulse RSTPB is created. A configuration and an operation of the error output latch circuit 34 will be described more fully with reference to FIG. 8 later.

Figure 7:
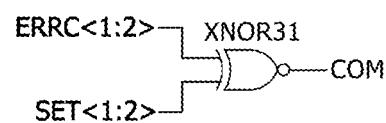
FIG. 7 is a circuit diagram illustrating an example of a comparison circuit included in the error count signal generation circuit of FIG. 6.

Referring to FIG. 7, the comparison circuit 333 may include an exclusive NOR gate XNOR31. The comparison circuit 333 may generate the comparison signal COM which is enabled to have a logic "high" level if the error code ERRC<1:2> and the set code SET<1:2> have the same logic level combination. Although FIG. 7 illustrates a single exclusive NOR gate, the number of exclusive NOR gates may be equal to the number of bits included in the error code ERRC<1:2> or the set code SET<1:2>.

Figure 8:
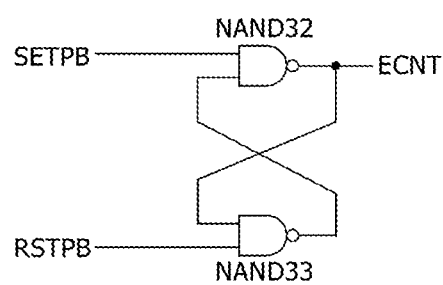
FIG. 8 is a circuit diagram illustrating an example of an output latch circuit included in the error count signal generation circuit of FIG. 6.

Referring to FIG. 8, the error output latch circuit 34 may include NAND gates NAND32 and NAND33. The error output latch circuit 34 may generate the error count signal ECNT which is enabled to have a logic "high" level if the set pulse SETPB is created. The error output latch circuit 34 may generate the error count signal ECNT which is disabled to have a logic "low" level if the reset pulse RSTPB is created. The error output latch circuit 34 may generate the error count signal ECNT in synchronization with the set pulse SETPB and the reset pulse RSTPB.

Figure 9:
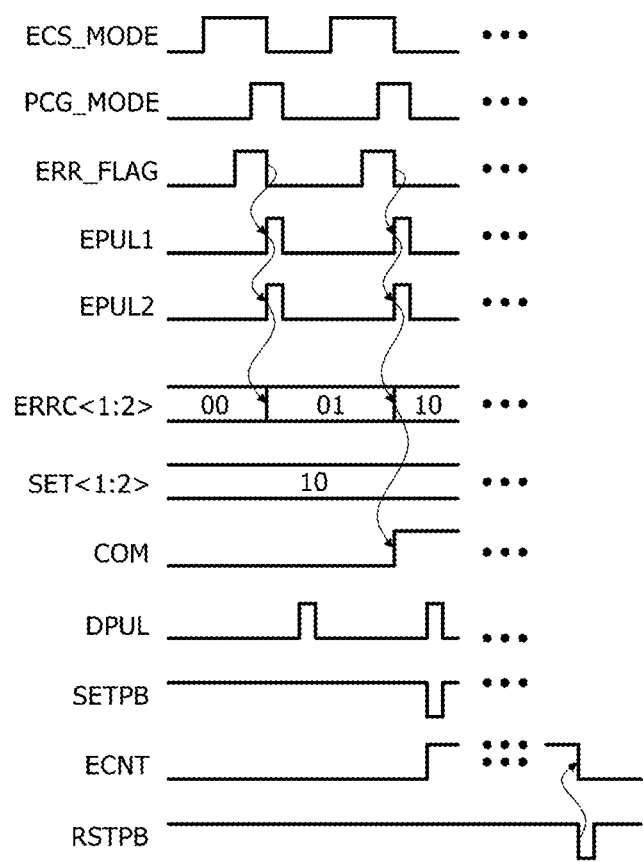
FIG. 9 is a timing diagram illustrating operation of the error count signal generation circuit shown in FIGS. 6 to 8.

An operation of the error count signal generation circuit 3 will be described hereinafter with reference to FIG. 9.

The error scrub mode signal ECS_MODE and the pre-charge mode signal PCG_MODE may be sequentially and repeatedly toggled to execute the error scrub operations of the memory cells which are selected, and the error flag ERR_FLAG may be enabled if the selected memory cell has erroneous datum. After both the pre-charge mode signal PCG_MODE and the error flag ERR_FLAG are set to have a logic "high" level, the first and second error pulses EPUL1 and EPUL2 may be sequentially created in synchronization with a point of time that a level of the pre-charge mode signal PCG_MODE or the error flag ERR_FLAG changes from a logic "high" level into a logic "low" level. The error code ERRC<1:2> initialized to have a logic level combination of '00' may be counted to have logic level combinations of '01' and '10' in sequence in synchronization with the second error pulse EPUL2. If the error code ERRC<1:2> is set to have a logic level combination of '10', the comparison signal COM may be enabled to have a logic "high" level because the error code ERRC<1:2> has the same logic level combination as the set code SET<1:2>. The set pulse SETPB may be generated by the delayed pulse DPUL which is created while the comparison signal COM has a logic "high" level, and the error count signal ECNT may be enabled to have a logic "high" level by the set pulse SETPB. The error count signal ECNT may be disabled to have a logic "low" level if the reset pulse RSTPB is created for each row path.

The error count signal generation circuit 3 may determine whether the selected memory cell has erroneous datum and may generate the error count signal ECNT which is enabled if the number of erroneous data of the memory cells included in the semiconductor device is equal to a predetermined number which is set according to the set code SET<1:2>.

Figure 10:
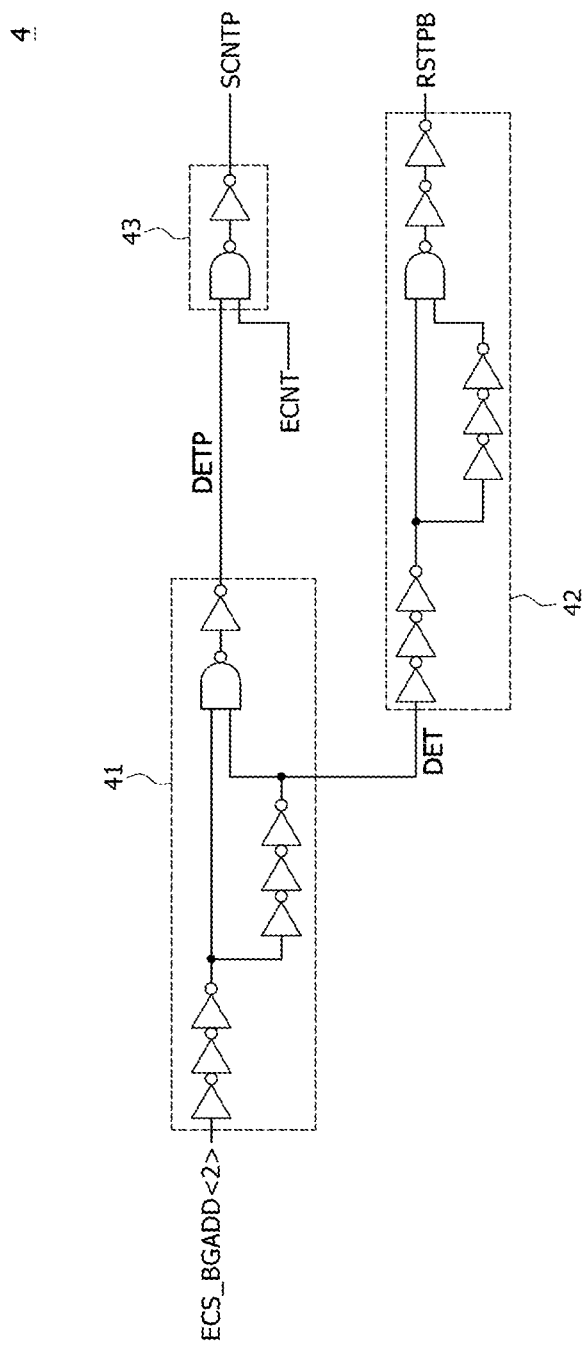
FIG. 10 is a circuit diagram illustrating an example of a control pulse generation circuit included in the semiconductor device of FIG. 1.

Referring to FIG. 10, the control pulse generation circuit 4 may include a detection pulse generation circuit 41, a reset pulse output circuit 42, and a storage control pulse output circuit 43.

The detection pulse generation circuit 41 may generate a detection signal DET and a detection pulse DETP in response to the second error scrub bank group address ECS_BGADD<2>. If the error scrub operations of all of the memory cells included in the bank groups (not shown) terminate, a level of the second error scrub bank group address ECS_BGADD<2> may change from a logic "high" level into a logic "low" level. The detection pulse generation circuit 41 may delay the second error scrub bank group address ECS_BGADD<2> a predetermined delay time to generate the detection signal DET. The detection pulse generation circuit 41 may be synchronized with a falling edge of the second error scrub bank group address ECS_BGADD<2> to generate the detection pulse DETP.

The reset pulse output circuit 42 may generate the reset pulse RSTPB in response to the detection signal DET. The reset pulse output circuit 42 may be synchronized with a falling edge of the detection signal DET to generate the reset pulse RSTPB.

The storage control pulse output circuit 43 may generate the storage control pulse SCNTP in response to the detection pulse DETP and the error count signal ECNT. The storage control pulse output circuit 43 may generate the storage control pulse SCNTP having a logic "high" level in synchronization with a point of time that the detection pulse DETP is created to have a logic "high" level, while the error count signal ECNT is enabled to have a logic "high" level.

Figure 11:
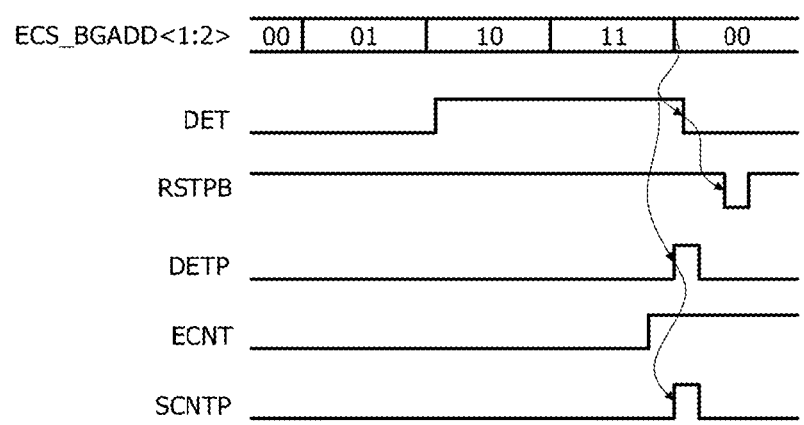
FIG. 11 is a timing diagram illustrating operation of the control pulse generation circuit shown in FIG. 10.

An operation of the control pulse generation circuit 4 will be described hereinafter with reference to FIG. 11.

After the error scrub bank group address ECS_BGADD<1:2> is counted to have logic level combinations of '00', '01', '10', and '11' in sequence to execute the error scrub operations of all of the memory cells included in the bank groups (not shown), the error scrub bank group address ECS_BGADD<1:2> may be counted to have a logic level combination of '00' again. A level of the detection signal DET may also change from a logic "high" level into a logic "low" level in synchronization with a point of time that a level of the second error scrub bank group address ECS_BGADD<2> changes from a logic "high" level into a logic "low" level. The detection pulse DETP may be created in synchronization with a point of time that a level of the second error scrub bank group address ECS_BGADD<2> changes from a logic "high" level into a logic "low" level. The reset pulse RSTPB having a logic "low" level may be created in synchronization with a point of time that a level of the detection signal DET changes from a logic "high" level into a logic "low" level. The storage control pulse SCNTP having a logic "high" level may be created in synchronization with a point of time that the detection pulse DETP having a logic "high" level is created while the error count signal ECNT is enabled to have a logic "high" level.

Figure 12:
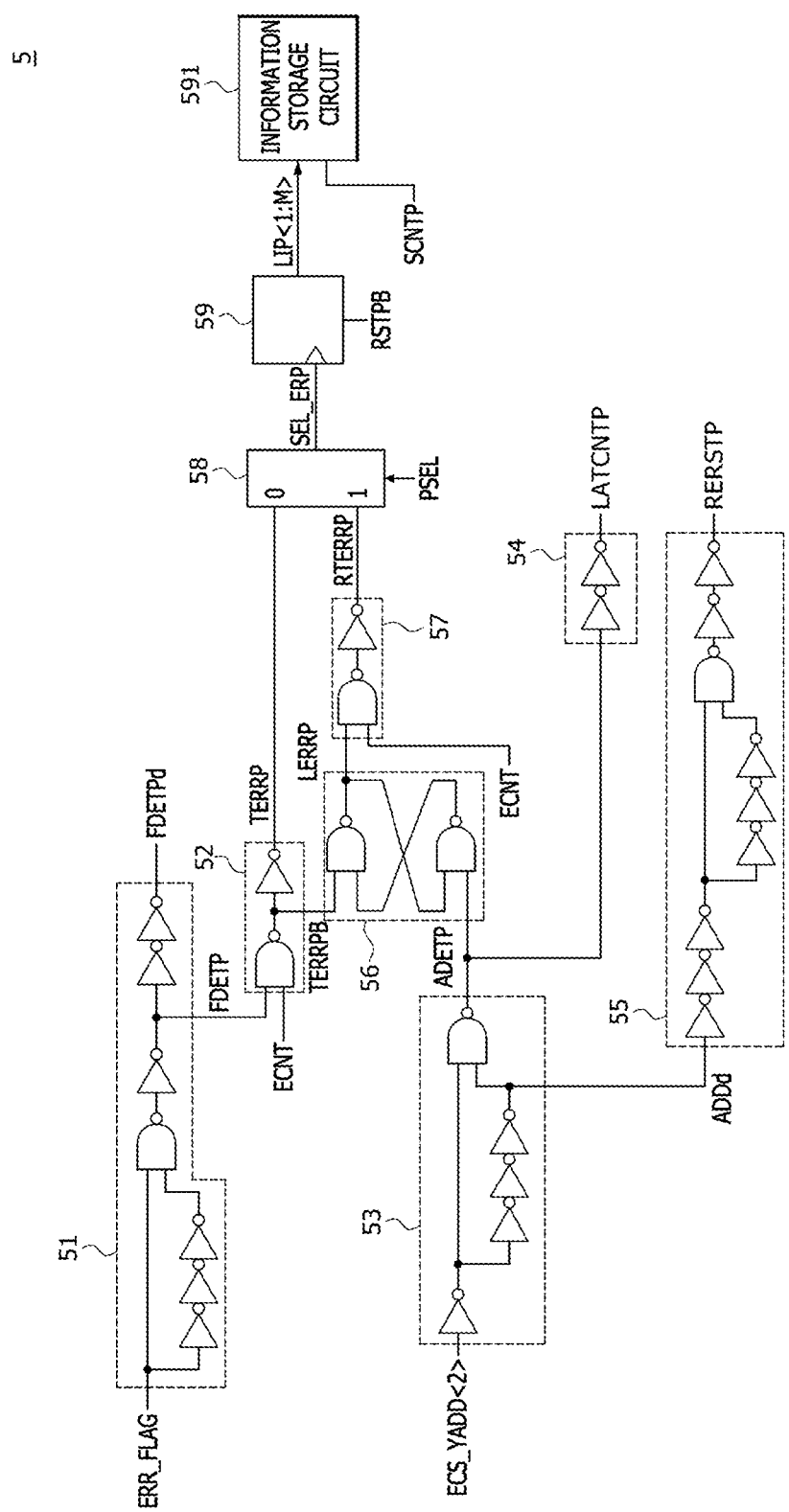
FIG. 12 is a circuit diagram illustrating an example of a row error control circuit included in the semiconductor device of FIG. 1.

Referring to FIG. 12, the row error control circuit 5 may include a flag detection pulse generation circuit 51, a critical error pulse generation circuit 52, an address detection pulse generation circuit 53, a latch control pulse output circuit 54, a row error reset pulse output circuit 55, a latch critical error pulse generation circuit 56, a row critical error pulse generation circuit 57, a pulse selection circuit 58, a latch information generation circuit 59, and an information storage circuit 591.

The flag detection pulse generation circuit 51 may generate a flag detection pulse FDETP and a delayed flag detection pulse FDETPd in response to the error flag ERR_FLAG. The flag detection pulse generation circuit 51 may generate the flag detection pulse FDETP in synchronization with a point of time that a level of the error flag ERR_FLAG changes from a logic "low" level into a logic "high" level when the selected memory cell has erroneous datum. The flag detection pulse generation circuit 51 may delay the flag detection pulse FDETP a predetermined delay time to generate the delayed flag detection pulse FDETPd. The predetermined delay time corresponding to a period from a point of time that the flag detection pulse FDETP is created until a point of time that the delayed flag detection pulse FDETPd is created may be set to be different according to the embodiments.

The critical error pulse generation circuit 52 may generate a critical error pulse TERRP in response to the flag detection pulse FDETP and the error count signal ECNT. The critical error pulse generation circuit 52 may generate an inverted critical error pulse TERRPB having a logic "low" level and the critical error pulse TERRP having a logic "high" level if the flag detection pulse FDETP is created while the error count signal ECNT is enabled to a logic "high" level. The critical error pulse generation circuit 52 may generate the inverted critical error pulse TERRPB and the critical error pulse TERRP in synchronization with the flag detection pulse FDETP which is created if the selected memory cell has additional erroneous datum from a point of time that the number of erroneous data of the memory cells whose error scrub operations are performed is equal to a predetermined number.

The address detection pulse generation circuit 53 may generate a delayed address ADDd and an address detection pulse ADETP in response to the second error scrub column address ECS_YADD<2>. After all of the memory cells connected to one row path included in a selected bank are sequentially selected, a level of the second error scrub column address ECS_YADD<2> may change from a logic "high" level into a logic "low" level to select another row path included in the selected bank. The address detection pulse generation circuit 53 may delay the second error scrub column address ECS_YADD<2> a predetermined delay time to generate the delayed address ADDd. The address detection pulse generation circuit 53 may be synchronized with a falling edge of the second error scrub column address ECS_YADD<2> to generate the address detection pulse ADETP having a logic "low" level.

The latch control pulse output circuit 54 may generate the latch control pulse LATCNTP in response to the address detection pulse ADETP. The latch control pulse output circuit 54 may generate the latch control pulse LATCNTP in synchronization with a point of time that the address detection pulse ADETP is created.

The row error reset pulse output circuit 55 may generate the row error reset pulse RERSTP in response to the delayed address ADDd. The row error reset pulse output circuit 55 may generate the row error reset pulse RERSTP in synchronization with a falling edge of the delayed address ADDd.

The latch critical error pulse generation circuit 56 may generate a latch critical error pulse LERRP in response to the inverted critical error pulse TERRPB and the address detection pulse ADETP. The latch critical error pulse generation circuit 56 may generate the latch critical error pulse LERRP having a logic "high" level if the inverted critical error pulse TERRPB having a logic "low" level is created. The latch critical error pulse generation circuit 56 may generate the latch critical error pulse LERRP having a logic "low" level if the address detection pulse ADETP having a logic "low" level is created.

The row critical error pulse generation circuit 57 may generate a row critical error pulse RTERRP in response to the latch critical error pulse LERRP and the error count signal ECNT. The row critical error pulse RTERRP may be generated when an additional erroneous datum is detected for each of the row paths from a point of time that the number of the erroneous data of the cells selected during the error scrub operation is equal to a predetermined number. The row critical error pulse generation circuit 57 may buffer the latch critical error pulse LERRP to generate the row critical error pulse RTERRP while the error count signal ECNT has a logic "high" level.

The pulse selection circuit 58 may output the critical error pulse TERRP or the row critical error pulse RTERRP as a selected error pulse SEL_ERP in response to the pulse selection signal PSEL. The pulse selection circuit 58 may output the critical error pulse TERRP as the selected error pulse SEL_ERP if the pulse selection signal PSEL has a logic "low" level. The pulse selection circuit 58 may output the row critical error pulse RTERRP as the selected error pulse SEL_ERP if the pulse selection signal PSEL has a logic "high" level. The pulse selection signal PSEL may be set to have a logic "low" level if information on the number of erroneous data more than a predetermined number is stored in the row error information storage circuit 6, and the pulse selection signal PSEL may be set to have a logic "high" level if information on the number of the row paths exhibiting the erroneous data is stored in the row error information storage circuit 6 after the erroneous data more than the predetermined number occurs. A logic level of the pulse selection signal PSEL may be set to be different according to the embodiments.

The latch information generation circuit 59 may output a latch information signal LIP<1:M> that is counted in synchronization with the selected error pulse SEL_ERP. The latch information generation circuit 59 may increase a logic level combination of the latch information signal LIP<1:M> by one bit whenever the selected error pulse SEL_ERP is created. The latch information generation circuit 59 may initialize the latch information signal LIP<1:M> in response to the reset pulse RSTPB. In such a case, all of bits included in the latch information signal LIP<1:M> may be initialized to have a logic "low" level. A logic level combination of the initialized latch information signal LIP<1:M> may be set to be different according to the embodiments. The number "M" of bits included in the latch information signal LIP<1:M> may be set to be different according to the embodiments.

The information storage circuit 591 may store the latch information signal LIP<1:M> in response to the storage control pulse SCNTP. The information storage circuit 591 may include a plurality of latch circuits to store the latch information signal LIP<1:M> having a plurality of bits. The information storage circuit 591 may store the latch information signal LIP<1:M> therein in synchronization with a point of time that the storage control pulse SCNTP is created.

Figure 13:
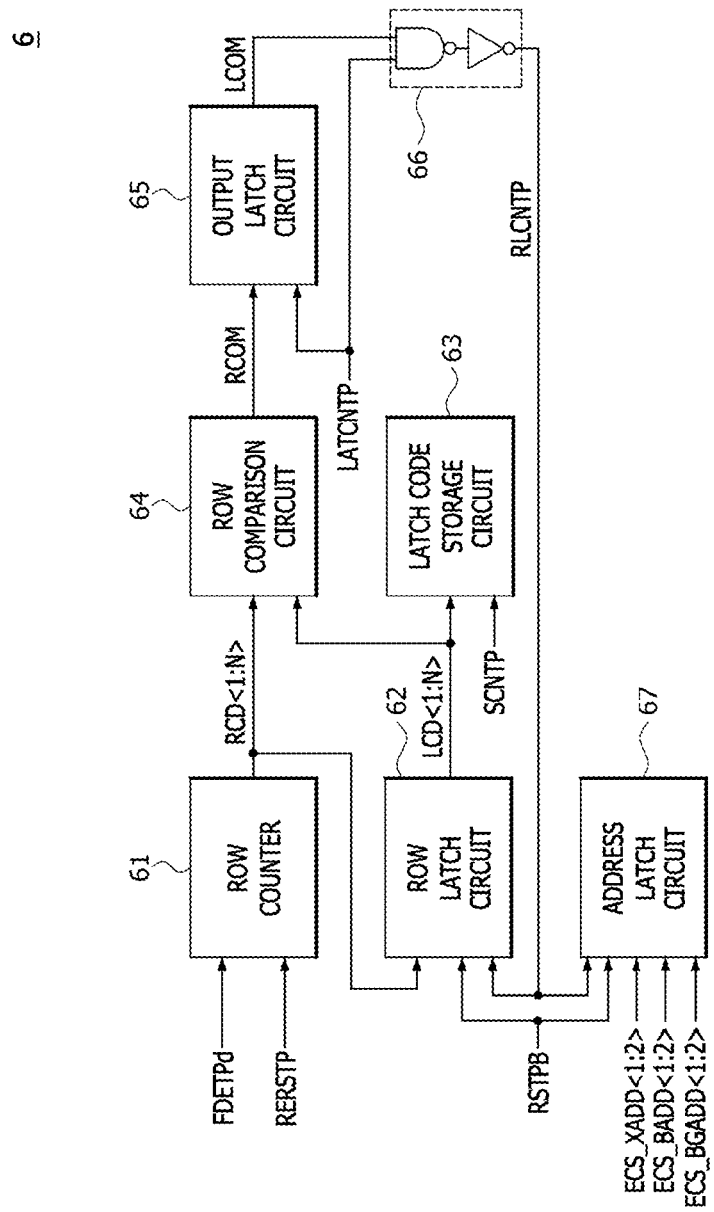
FIG. 13 is a block diagram illustrating a configuration of an example of a row error information storage circuit included in the semiconductor device of FIG. 1.

Referring to FIG. 13, the row error information storage circuit 6 may include a row counter 61, a row latch circuit 62, a latch code storage circuit 63, a row comparison circuit 64, a row output latch circuit 65, a row latch control pulse generation circuit 66, and an address latch circuit 67.

The row counter 61 may generate a row code RCD<1:N> in response to the delayed flag detection pulse FDETPd and the row error reset pulse RERSTP. The row counter 61 may count the row code RCD<1:N> if the delayed flag detection pulse FDETPd is created. In an embodiment, the row counter 61 my generate a row code RCD<1:N> which includes a count of the number of erroneous data included in the cells which are selected by the error scrub operation for each of the row paths. The row counter 61 may increase a logic level combination of the row code RCD<1:N> by one bit whenever the delayed flag detection pulse FDETPd is created. The row counter 61 may initialize the row code RCD<1:N> if the row error reset pulse RERSTP is created. In such a case, all of the bits included in the row code RCD<1:N> may be initialized to have a logic "low" level if the row error reset pulse RERSTP is created. A logic level combination of the initialized row code RCD<1:N> may be set to be different according to the embodiments. The number "N" of bits included in the row code RCD<1:N> may be set to be different according to the embodiments.

The row latch circuit 62 may latch the row code RCD<1:N> in response to a row latch control pulse RLCNTP. The row latch circuit 62 may latch the row code RCD<1:N> if the row latch control pulse RLCNTP is created. The row latch circuit 62 may output the latched row code as a latch code LCD<1:N> if, in one example, the row code RCD<1:N> is greater than the latch code LCD<1:N>. The row latch circuit 62 may initialize the latch code LCD<1:N> in response to the reset pulse RSTPB. A logic level combination of the initialized latch code LCD<1:N> may be set to be different according to the embodiments. The number "N" of bits included in the latch code LCD<1:N> may be set to be different according to the embodiments.

The latch code storage circuit 63 may receive and store the latch code LCD<1:N> in response to the storage control pulse SCNTP. The latch code storage circuit 63 may include a plurality of latch circuits to store the latch code LCD<1:N> having a plurality of bits. The latch code storage circuit 63 may receive and store the latch code LCD<1:N> if the storage control pulse SCNTP is created.

The row comparison circuit 64 may generate a row comparison signal RCOM in response to the row code RCD<1:N> and the latch code LCD<1:N>. The row comparison circuit 64 may generate the row comparison signal RCOM which is enabled if the row code RCD<1:N> is set to have a logic level combination which is greater than a logic level combination of the latch code LCD<1:N>. If each of the row code RCD<1:N> and the latch code LCD<1:N> has three bits, the row comparison signal RCOM may be enabled when the row code RCD<1:N> has logic level combinations of '101', '110' and '111' while the latch code LCD<1:N> is set to have a logic level combination of '100'. A logic level of the enabled row comparison signal RCOM may be set to be different according to the embodiments.

The row output latch circuit 65 may generate a latch comparison signal LCOM in response to the latch control pulse LATCNTP and the row comparison signal RCOM. The row output latch circuit 65 may latch the row comparison signal RCOM and may output the latched row comparison signal as the latch comparison signal LCOM, if the latch control pulse LATCNTP is created.

The row latch control pulse generation circuit 66 may generate the row latch control pulse RLCNTP in response to the latch control pulse LATCNTP and the latch comparison signal LCOM. The row latch control pulse generation circuit 66 may buffer the latch comparison signal LCOM in response to the latch control pulse LATCNTP to output the buffered latch control pulse as the row latch control pulse RLCNTP while the latch comparison signal LCOM is enabled to have a logic "high" level.

The address latch circuit 67 may latch the error scrub row address ECS_XADD<1:2>, the error scrub bank address ECS_BADD<1:2>, and the error scrub bank group address ECS_BGADD<1:2> in response to the row latch control pulse RLCNTP. The address latch circuit 67 may latch the error scrub row address ECS_XADD<1:2>, the error scrub bank address ECS_BADD<1:2>, and the error scrub bank group address ECS_BGADD<1:2> if the row latch control pulse RLCNTP is created. The address latch circuit 67 may be initialized in response to the reset pulse RSTPB. If the address latch circuit 67 is initialized, information on the error scrub row address ECS_XADD<1:2>, the error scrub bank address ECS_BADD<1:2>, and the error scrub bank group address ECS_BGADD<1:2> stored in the address latch circuit 67 may be deleted. The address latch circuit 67 may latch information on the row paths if the row code RCD<1:N> is set to be greater than the latch code LCD<1:N>.

As described above, a semiconductor device according to an embodiment may sequentially perform error scrub operations of memory cells included therein to determine whether the memory cells have erroneous data and may store information on the number of the erroneous data if the number of the erroneous data of the memory cells is greater than or equal to a predetermined number or information on the number of the erroneous data for at least one row address if the number of the erroneous data for the at least one row address is greater than or equal to the predetermined number. In addition, the semiconductor device may detect and store the information on a row address having the most erroneous data for each row path and the information on the number of the most erroneous data. Accordingly, it may be possible to correctly monitor the statuses of the memory cells included in the semiconductor device using the information stored in the semiconductor device.

Figure 14:
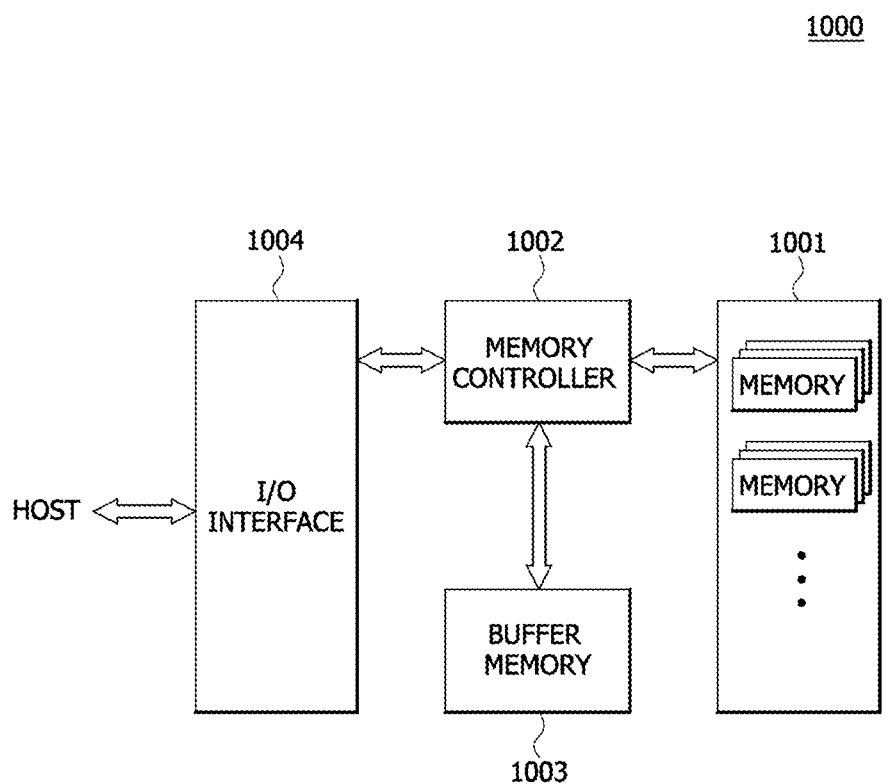
FIG. 14 is a block diagram illustrating a configuration an example of an electronic system employing the semiconductor device shown in FIGS. 1 and 13.

The semiconductor device described with reference to FIGS. 1 to 13 may be applied to an electronic system that includes a memory system, a graphic system, a computing system, a mobile system, or the like. For example, as illustrated in FIG. 14, an electronic system 1000 according to an embodiment may include a data storage circuit 1001, a memory controller 1002, a buffer memory 1003, and an input/output (I/O) interface 1004.

The data storage circuit 1001 may store data which are outputted from the memory controller 1002 or may read and output the stored data to the memory controller 1002, according to a control signal outputted from the memory controller 1002. The data storage circuit 1001 may include the semiconductor device illustrated in FIG. 1. Meanwhile, the data storage circuit 1001 may include a nonvolatile memory that can retain stored data even when its power supply is interrupted. The nonvolatile memory may be a flash memory such as a NOR-type flash memory or a NAND-type flash memory, a phase change random access memory (PRAM), a resistive random access memory (RRAM), a spin transfer torque random access memory (STTRAM), a magnetic random access memory (MRAM), or the like.

The memory controller 1002 may receive a command outputted from an external device (e.g., a host device) through the I/O interface 1004 and may decode the command outputted from the host device to control an operation for inputting data into the data storage circuit 1001 or the buffer memory 1003 or for outputting the data stored in the data storage circuit 1001 or the buffer memory 1003. Although FIG. 14 illustrates the memory controller 1002 with a single block, the memory controller 1002 may include one controller for controlling the data storage circuit 1001 comprised of a nonvolatile memory and another controller for controlling the buffer memory 1003 comprised of a volatile memory.

The buffer memory 1003 may temporarily store data which is processed by the memory controller 1002. That is, the buffer memory 1003 may temporarily store data which is outputted from or inputted to the data storage circuit 1001. The buffer memory 1003 may store data, which is outputted from the memory controller 1002, according to a control signal. The buffer memory 1003 may read and output the stored data to the memory controller 1002. The buffer memory 1003 may include a volatile memory such as a dynamic random access memory (DRAM), a mobile DRAM, or a static random access memory (SRAM).

The I/O interface 1004 may physically and electrically connect the memory controller 1002 to the external device (i.e., the host). Thus, the memory controller 1002 may receive control signals and data supplied from the external device (i.e., the host) through the I/O interface 1004 and may output the data generated from the memory controller 1002 to the external device (i.e., the host) through the I/O interface 1004. That is, the electronic system 1000 may communicate with the host through the I/O interface 1004. The I/O interface 1004 may include any one of various interface protocols such as a universal serial bus (USB), a multimedia card (MMC), a peripheral component interconnect-express (PCI-E), a serial attached SCSI (SAS), a serial AT attachment (SATA), a parallel AT attachment (PATA), a small computer system interface (SCSI), an enhanced small device interface (ESDI), and an integrated drive electronics (IDE).

The electronic system 1000 may be used as an auxiliary storage device of the host or an external storage device. The electronic system 1000 may include a solid state disk (SSD), a USB memory, a secure digital (SD) card, a mini secure digital (mSD) card, a micro secure digital (micro SD) card, a secure digital high capacity (SDHC) card, a memory stick card, a smart media (SM) card, a multi-media card (MMC), an embedded multi-media card (eMMC), a compact flash (CF) card, or the like.

What is claimed is:
1. A semiconductor device comprising:
an error count signal generation circuit configured to generate an error count signal when the number of erroneous data of cells selected to perform an error scrub operation is equal to a single, predetermined number having a single, pre-determined value; and
a pulse selection circuit configured to output a critical error pulse or a row critical error pulse as a selected error pulse in response to a pulse selection signal, wherein the critical error pulse is generated whenever an additional erroneous datum is detected when the number of the erroneous data of the cells selected during the error scrub operation is equal to the single, predetermined number having a single, predetermined value, and wherein the row critical error pulse is generated whenever an additional erroneous datum is detected for each of the row paths when the number of the erroneous data of the cells selected during the error scrub operation is equal to the single, predetermined number having a single, predetermined value.

2. The semiconductor device of claim 1, wherein the predetermined number is set according to a set code.

3. The semiconductor device of claim 1,
wherein the error count signal generation circuit is configured to generate the error count signal in response to a pre-charge mode signal and an error flag;
wherein the pre-charge mode signal is enabled in synchronization with a point of time that the error scrub operation of each of the selected cells terminates; and
wherein the error flag is enabled if an erroneous datum is included in the cell which is selected for the error scrub operation.

4. The semiconductor device of claim 1, wherein the error count signal generation circuit includes:
a set pulse generation circuit configured to generate a set pulse if the number of erroneous data corresponding to an error code counted when the selected cell includes an erroneous datum is equal to the predetermined number; and
an error output latch circuit configured to generate the error count signal in synchronization with the set pulse and a reset pulse.

5. The semiconductor device of claim 4, wherein the set pulse generation circuit includes:
an error code generation circuit configured to generate the error code;
a comparison circuit configured to compare the error code with a set code to generate a comparison signal; and
a set pulse output circuit configured to generate the set pulse in response to the comparison signal.

6. The semiconductor device of claim 4, wherein the reset pulse is generated after the error scrub operation of all of the cells is performed.

7. The semiconductor device of claim 4, wherein the error count signal generation circuit further includes:
a first error pulse generation circuit configured to generate a first error pulse in response to a pre-charge mode signal and an error flag; and
a second error pulse generation circuit configured to generate a second error pulse in response to the error count signal and the first error pulse.

8. The semiconductor device of claim 1, wherein the row error control circuit further includes a latch information generation circuit configured to output a latch information signal that is counted in synchronization with the selected error pulse.

9. The semiconductor device of claim 8, wherein the row error control circuit further includes an information storage circuit configured to store the latch information signal in synchronization with a storage control pulse.

10. The semiconductor device of claim 1, wherein the row error control circuit further includes:
   a flag detection pulse generation circuit configured to generate a flag detection pulse in response to an error flag; and
   a critical error pulse generation circuit configured to generate the critical error pulse in response to the flag detection pulse and the error count signal.

11. The semiconductor device of claim 1, wherein the row error control circuit further includes:
   an address detection pulse generation circuit configured to generate an address detection pulse in response to an error scrub column address; and
   a latch critical error pulse generation circuit configured to generate a latch critical error pulse in response to the address detection pulse and an inverted critical error pulse.

12. The semiconductor device of claim 1, further comprising a row error information storage circuit configured to detect one row path exhibiting the most erroneous data among the row paths using the error scrub operation and configured to store information concerning the detected row path and information concerning the number of the erroneous data of the cells connected to the detected row path.

13. The semiconductor device of claim 12, wherein the row error information storage circuit includes:
   a row counter configured to generate a row code that includes a count of the number of the erroneous data included in the cells which are selected by the error scrub operation for each of the row paths; and
   a row latch circuit configured to latch the row code to output the latched row code as a latch code if the row code is set to be greater than the latch code.

14. The semiconductor device of claim 13, wherein the row error information storage circuit further includes an address latch circuit configured to latch information concerning the row paths if the row code is set to be greater than the latch code.

15. The semiconductor device of claim 13, wherein the row error information storage circuit further includes:
   a row comparison circuit configured to compare the row code with the latch code to generate a row comparison signal;
   a row output latch circuit configured to output the row comparison signal as a latch comparison signal in response to a latch control pulse which is created for each of the row paths; and
   a row latch control pulse generation circuit configured to buffer the latch comparison signal in response to the latch control pulse to generate a row latch control pulse.

16. The semiconductor device of claim 1, further comprising a mode signal generation circuit configured to generate an error scrub mode signal which is enabled during a period that the error scrub operation is performed and configured to generate a pre-charge mode signal which is enabled in synchronization with a point of time that the error scrub operation terminates.

17. The semiconductor device of claim 1, further comprising an address generation circuit configured to sequentially count an error scrub column address, an error scrub row address, an error scrub bank address, and an error scrub bank group address in response to an error scrub mode signal which is enabled while the error scrub operation is performed.

18. The semiconductor device of claim 1, further comprising a control pulse generation circuit configured to generate a reset pulse for each of the row paths and configured to generate a storage control pulse for each of the row paths while the error count signal is enabled.

\* \* \* \* \*